US011289357B2

United States Patent
Wada et al.

(10) Patent No.: US 11,289,357 B2
(45) Date of Patent: Mar. 29, 2022

(54) METHODS AND APPARATUS FOR HIGH VOLTAGE ELECTROSTATIC CHUCK PROTECTION

(71) Applicant: APPLIED MATERIALS, INC., Santa Clara, CA (US)

(72) Inventors: Yuichi Wada, Chiba (JP); Yueh Sheng Ow, Singapore (SG); Ananthkrishna Jupudi, Singapore (SG); Clinton Goh, Singapore (SG); Kai Liang Liew, North East Singapore (SG); Sarath Babu, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 226 days.

(21) Appl. No.: 16/550,521

(22) Filed: Aug. 26, 2019

(65) Prior Publication Data

US 2020/0411353 A1 Dec. 31, 2020

Related U.S. Application Data

(60) Provisional application No. 62/867,527, filed on Jun. 27, 2019.

(51) Int. Cl.
*H01L 21/683* (2006.01)

(52) U.S. Cl.
CPC ................................ *H01L 21/6833* (2013.01)

(58) Field of Classification Search
CPC .................................................. H01L 21/6833
See application file for complete search history.

(56) References Cited

U.S. PATENT DOCUMENTS

| | | | | |
|---|---|---|---|---|
| 6,041,733 A * | 3/2000 | Kim | .................... | H01J 37/3244 118/723 E |
| 6,847,516 B2 | 1/2005 | Kwon et al. | | |
| 8,372,205 B2 | 2/2013 | Choi et al. | | |
| 9,218,997 B2 | 12/2015 | Jun et al. | | |
| 9,624,593 B2 | 4/2017 | Sun et al. | | |
| 2013/0104930 A1* | 5/2013 | Shih | .................. | H01J 37/32862 134/1 |
| 2014/0377504 A1* | 12/2014 | Sun | ........................ | C23C 14/22 428/141 |

OTHER PUBLICATIONS

Understanding Aluminum Anodic Oxide Film Formation: Improving Engineering Properties Through Microstructural Modification, Runge et al., May 10, 2006.

* cited by examiner

*Primary Examiner* — Scott Bauer
(74) *Attorney, Agent, or Firm* — Moser Taboada

(57) ABSTRACT

Methods and apparatus for increasing voltage breakdown levels of an electrostatic chuck in a process chamber. A soft anodization layer with a thickness of greater than zero and less than approximately 10 microns is formed on an aluminum base of the electrostatic chuck. The soft anodization layer remains thermally elastic in a temperature range of approximately −50 degrees Celsius to approximately 100 degrees Celsius. An alumina spray coating is then applied on the soft anodization layer. The soft anodization layer provides thermal stress relief between the aluminum base and the alumina spray coating to reduce/eliminate cracking caused by the thermal expansion rate differences between the aluminum base and the alumina spray coating.

20 Claims, 3 Drawing Sheets

METHODS AND APPARATUS FOR HIGH VOLTAGE ELECTROSTATIC CHUCK PROTECTION

CROSS-REFERENCE TO RELATED APPLICATIONS

This application claims benefit of U.S. provisional application Ser. No. 62/867,527, filed Jun. 27, 2019, which is herein incorporated by reference in its entirety.

FIELD

Embodiments of the present principles generally relate to semiconductor processing.

BACKGROUND

A plasma process is often performed in vacuum by evacuating gas from a processing chamber. In such a process, a substrate is placed on an electrostatic chuck (ESC) that is arranged on a stage of the processing chamber. The electrostatic chuck includes a conductive sheet-type chuck electrode that is arranged between dielectric members. When performing a plasma process, a voltage from a direct current voltage source is applied to the electrostatic source so that the substrate is chucked to the electrostatic chuck by a Coulomb force generated from the voltage application. The inventors have found that when the voltage on the ESC increases, a breakdown of the dielectric member on the surface of the ESC occurs causing arcing and plasma disruption. Accordingly, the inventors have provided improved methods and apparatus for increasing high voltage breakdown levels during processing of the substrate.

SUMMARY

Methods and apparatus for increasing high voltage breakdown levels of an electrostatic chuck for use in semiconductor processing are provided herein.

In some embodiments, an electrostatic chuck for holding substrates in a process chamber may comprise an aluminum base, an anodized layer on the aluminum base, wherein the anodized layer has a non-columnar structure and a thickness of greater than zero and less than approximately 10 microns, and an alumina layer on the anodized layer, wherein the alumina layer has a thickness of approximately 200 microns to approximately 300 microns.

In some embodiments, the electrostatic chuck may further comprise wherein the electrostatic chuck has a breakdown voltage of approximately 2 kV or more, wherein the anodized layer is a soft anodized layer, wherein the anodized layer is configured to provide thermal expansion and contraction stress relief between the aluminum base and the alumina layer to reduce cracking of the alumina layer, wherein the alumina layer is formed by spray coating alumina on the anodized layer, wherein the anodized layer provides approximately 10 volts of insulative protection for approximately every one micron of thickness, and/or wherein the anodized layer is thermally elastic in a temperature range of approximately −50 degrees Celsius to approximately 100 degrees Celsius.

In some embodiments, an electrostatic chuck for holding substrates in a process chamber may comprise an aluminum base; an anodized layer on the aluminum base, wherein the anodized layer is a soft anodized layer with a non-columnar structure and a thickness of greater than zero and less than approximately 10 microns; and an alumina layer on the anodized layer, wherein the alumina layer has a thickness of approximately 200 microns to approximately 300 microns, and wherein the electrostatic chuck has a breakdown voltage of approximately 2 kV or more.

In some embodiments, the electrostatic chuck may further comprise wherein the anodized layer is configured to provide thermal expansion and contraction stress relief between the aluminum base and the alumina layer to reduce cracking of the alumina layer, wherein the alumina layer is formed by spray coating alumina on the anodized layer, wherein the anodized layer provides approximately 10 volts of insulative protection for approximately every one micron of thickness, wherein the anodized layer is thermally elastic in a temperature range of approximately −50 degrees Celsius to approximately 100 degrees Celsius, and/or wherein the breakdown voltage is approximately 2 kV to approximately 3 kV.

In some embodiments, a method for increasing voltage breakdown levels of an electrostatic chuck comprises forming a first layer on an aluminum base of the electrostatic chuck, the first layer being a first dielectric material with thermally elastic properties in a temperature range of approximately −50 degrees Celsius to approximately 100 degrees Celsius and forming a second layer on the first layer, the second layer being a second dielectric material.

In some embodiments, the method may further comprise forming the first layer on the aluminum base using a soft anodization process that does not produce a columnar structure in the first layer, forming the second layer by spray coating alumina on the first layer, forming the first layer on the aluminum base with a thickness of greater than zero and less than approximately 10 microns, forming the second layer on the first layer with a thickness of approximately 200 microns to approximately 300 microns, wherein the first dielectric material provides approximately 10 volts of insulative protection for approximately every one micron of thickness, and/or wherein the first layer provides thermal expansion and contraction stress relief between the aluminum base and the second layer.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
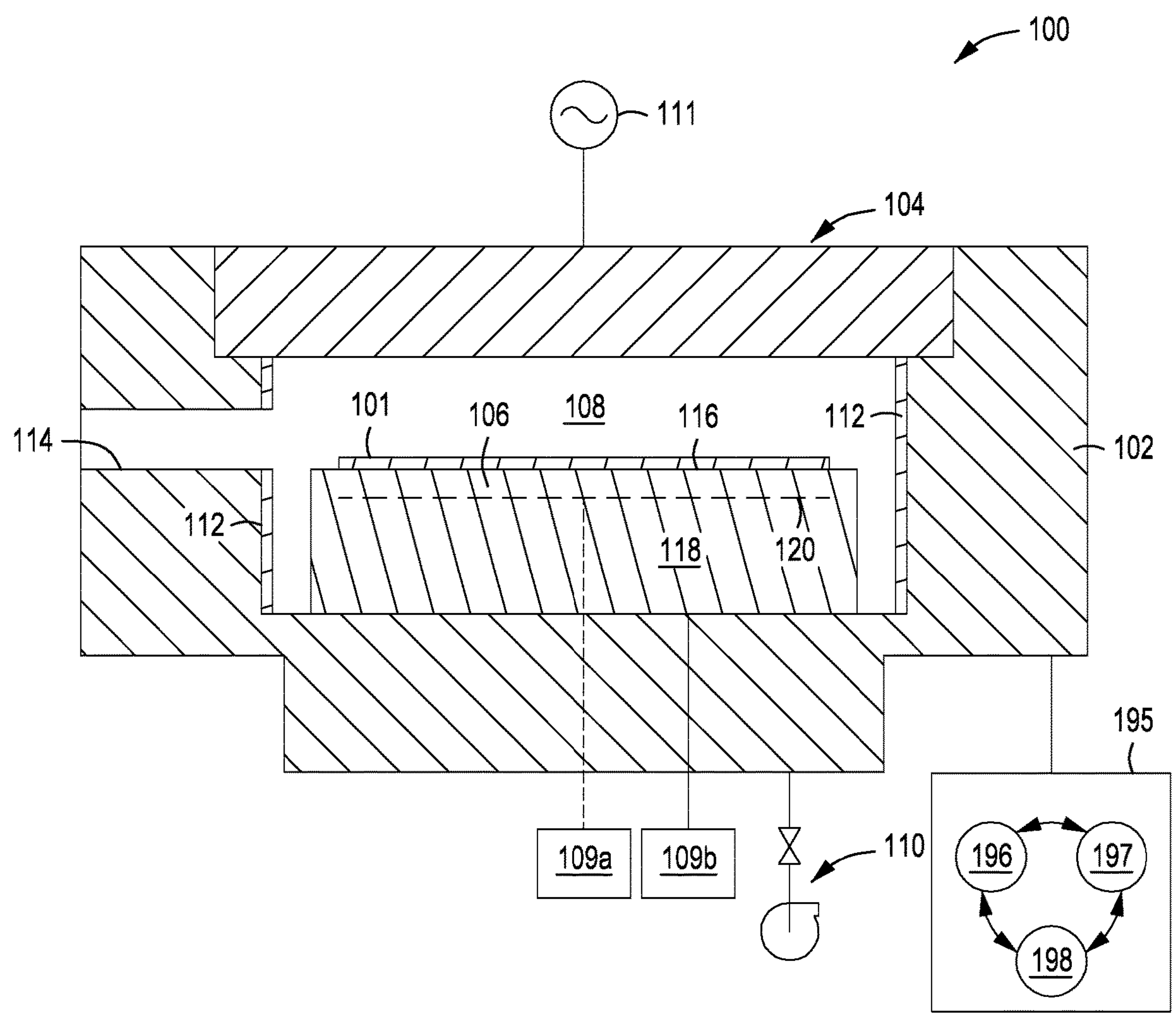
FIG. 1 is a cross-sectional view of a processing chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide increased high voltage breakdown levels for electrostatic chucks used in a semiconductor process chamber. Aluminum oxide ($Al_2O_3$) or alumina may be used as a dielectric coating on the aluminum base of electrostatic chucks. Temperatures often increase and decrease in a semiconductor chamber during substrate processing. The temperature changes cause assemblies within the semiconductor chamber to expand and contract. The inventors have found that during semiconductor processing the alumina coating develops cracks caused by the aluminum base having a greater coefficient of thermal expansion than the coefficient of thermal expansion of the alumina coating. Cracking caused by the difference in thermal expansions along with the porosity of the alumina coating may lead to a breaking down of the electrically insulative characteristics of the dielectric layer provided by the alumina coating as voltages applied to the electrostatic chuck increase. The inventors have found that the electrostatic chuck breakdown voltage with an alumina coating is approximately 1.1 kV.

In many substrate packaging applications, uniform chucking of the substrate at high voltages is used to control processing temperatures. Lower temperatures yield less outgassing during the substrate processing. The inventors have found that by using a dielectric layer between the alumina base and alumina coating, the breakdown voltage of the electrostatic chuck may be increased to a range of approximately 2 kV to approximately 3 kV or more. The dielectric layer has an elastic characteristic that helps to buffer the higher thermal expansion rate of the aluminum base from the lower thermal expansion rate of the alumina coating, preventing cracking of the alumina coating. The intermediate dielectric layer retains the elastic characteristic from approximately −50 degrees Celsius to approximately 100 degrees Celsius. The dielectric layer also provides additional electrical insulation or boundary for areas of the alumina coating that are not uniform due to spray limitations (e.g., spray angle, coverage thickness variations, etc.).

In some embodiments, the dielectric layer is an anodization layer formed on surfaces of the aluminum base of the electrostatic chuck. The anodization layer helps to enable high voltage chucking as well as to prevent premature voltage breakdown/arcing. The anodization layer also provides improved electrical isolation between a substrate and the electrostatic chuck surface and better alumina coating adhesion to the electrostatic chuck. The anodization layer is formed prior to alumina arc spray coating to achieve the higher chucking voltages. The higher chucking voltages then allow better temperature control to enhance the substrate processing. The anodization layer addresses the causes of electrostatic chuck arcing such as porous alumina coatings created during arc spray and lack of spray control on the sidewall and lift pin holes of the electrostatic chuck that results in non-uniformity of substrate film coverage across different electrostatic chucks. In some embodiments, the anodization layer is created by using a weak acid on the aluminum base prior to applying an alumina coating. The soft anodization process allows the anodization layer to retain thermal elasticity to compensate for the different expansion and contraction rates between the alumina coating and the aluminum base during substrate processes. With the anodization layer, an electrostatic chuck may be able to withstand up to or beyond a 2.5 times higher chucking voltage compared to electrostatic chucks without the anodization layer.

In some embodiments, the alumina coating has a thickness of approximately 200 microns to approximately 300 microns. The alumina coating has a high level of porosity and may accumulate a lot of moisture during substrate processing. The porosity leads to electrostatic chuck breakdown or arcing and limits the electrostatic breakdown voltage to approximately 1.1 kV or less. The dielectric layer provides an electrical isolation layer to reduce or eliminate arcing due to the porous nature of the alumina coating and helps to increase the electrostatic breakdown voltage to a range of approximately 2 kV to approximately 3 kV or more. The dielectric layer is not required to have a high insulative value. In some embodiments, the insulative value may be approximately 10 volts for every one micron of thickness. In some embodiments, the thickness of the dielectric layer may be in a range of greater than zero microns to approximately 10 microns, and the insulative value may be in a range of approximately zero volts to approximately 100 volts for conduction prevention. The inventors have found that the thickness of the dielectric layer should be controlled so that the dielectric layer does not have a columnar structure. For example, if the dielectric layer is an anodization layer, if the anodization layer is formed of a thickness beyond 10 microns to approximately 100 microns or more, the anodization layer will have a columnar structure which creates pin holes in the anodization layer. If an anodization layer with pin holes is formed, the isolation characteristics of the anodization layer are lost, and the anodization layer will not function as an isolation layer and conduction may occur.

The inventors have also found that the hardness of the dielectric layer should be controlled to provide a buffer between the different thermal expansion coefficients of the aluminum base and the alumina coating. In some embodiments, the dielectric layer is a soft anodization layer. The soft anodization layer is created by using a weak acid with high temperatures and high current densities during the anodization process on a surface of the aluminum base of the electrostatic chuck. The random microstructure created by the process provides a sheet-like boundary layer without the pin holes found in a columnar structures associated with hard anodization processes. The soft anodization layer reduces the stress on the alumina coating caused by the thermal expansion and contraction of the aluminum base during substrate processing. The reduced stress on the alumina coating reduces or eliminates cracking of the alumina coating during substrate processing. If the anodization layer is very thick—approximately 300 microns to approximately 400 microns, the anodization layer will lose any elastic properties and will crack. A thick anodization layer will also increase surface temperatures of the electrostatic chuck. A thin anodization layer (e.g., approximately 10 microns or less) with an alumina coating of approximately 200 microns will yield an electrostatic chuck breakdown voltage of over 2 kV.

FIG. 1 is a cross sectional view of a processing chamber 100 in accordance with some embodiments. As shown, the processing chamber 100 is a chamber suitable for film deposition on a substrate, such as substrate 101. Examples of processing chambers which benefit from aspects described herein are available from Applied Materials, Inc., located in Santa Clara, Calif. Other processing chambers, including those from other manufacturers, may be adapted to benefit from aspects of the disclosure. In some embodiments, the processing chamber 100 includes a chamber body 102, a gas distribution plate assembly 104, and a substrate support 106. The chamber body 102 of the processing chamber 100 includes or may be formed from one or more process-compatible materials, such as aluminum, nickel plated aluminum, nickel plated aluminum 6061-T6, stainless steel, for example. The substrate support 106 functions as an electrode in conjunction with the gas distribution plate assembly 104. As such, a plasma may be formed in a processing volume 108 defined between the gas distribution plate assembly 104 and an upper surface of the substrate support 106. As discussed in more detail below, the substrate support 106 includes or is formed of a conductive material, such as aluminum, a ceramic material, or a combination of both. The chamber body 102 is also coupled to a vacuum system 110 that includes a pump and a valve, and a liner 112 may be disposed on surfaces of the chamber body 102 in the processing volume 108. The chamber body 102 includes a port 114 formed in a sidewall thereof. The port 114 is selectively opened and closed to allow access to the interior of the chamber body 102 by a substrate handling robot (not shown). In such an embodiment, a substrate 101 is transferred in and out of the processing chamber 100 through the port 114. The substrate 101 is positioned on the upper surface 116 of the substrate support 106 for processing. Lift pins (not shown) may be used to space the substrate 101 away from the upper surface of the substrate support 106, such as to enable exchange with the substrate handling robot during substrate transfer.

The gas distribution plate assembly 104 is positioned on the chamber body 102. A power source 111, such as a radio frequency (RF) power source, is coupled to gas distribution plate assembly 104 to electrically bias the gas distribution plate assembly 104 relative to the substrate support 106 to facilitate plasma generation within the processing chamber 100. The substrate support 106 includes an electrostatic chuck 118, in which the electrostatic chuck 118 may be connected to a power source **109*a* to facilitate chucking of the substrate 101 and/or to influence a plasma located within the processing volume 108. The power source 109*a* includes a power supply, such as a DC or RF power supply, and is connected to one or more electrodes 120 of the electrostatic chuck 118. A bias source 109*b* may additionally or alternatively be coupled with the substrate support 106 to assist with plasma generation and/or control, such as to an edge ring assembly. The bias source 109*b* may illustratively be a source of up to about 1000 W (but not limited to about 1000 W) of RF energy at a frequency of, for example, approximately 13.56 MHz, although other frequencies and powers may be provided as desired for particular applications. The bias source 109*b*** is capable of producing either or both of continuous or pulsed power. In some aspects, the bias source may be capable of providing multiple frequencies, such as 13.56 MHz and 2 MHz.

The processing chamber 100 may also include a controller 195. The controller 195 includes a programmable central processing unit (CPU) 196 that is operable with a memory 197 and a mass storage device, an input control unit, and a display unit (not shown), such as power supplies, clocks, cache, input/output (I/O) circuits, and the liner, coupled to the various components of the processing system to facilitate control of the substrate processing. To facilitate control of the processing chamber 100 described above, the CPU 196 may be one of any form of general purpose computer processor that can be used in an industrial setting, such as a programmable logic controller (PLC), for controlling various chambers and sub-processors. The memory 197 is coupled to the CPU 196 and the memory 197 is non-transitory and may be one or more of random access memory (RAM), read only memory (ROM), floppy disk drive, hard disk, or any other form of digital storage, local or remote. Support circuits 198 are coupled to the CPU 196 for supporting the processor. Applications or programs for charged species generation, heating, and other processes are generally stored in the memory 197, typically as software routine. The software routine may also be stored and/or executed by a second CPU (not shown) that is remotely located from the processing chamber 100 being controlled by the CPU 196.

The memory 197 is in the form of computer-readable storage media that contains instructions, when executed by the CPU 196, to facilitate the operation of the processing chamber 100. The instructions in the memory 197 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present disclosure.

Figure 2:
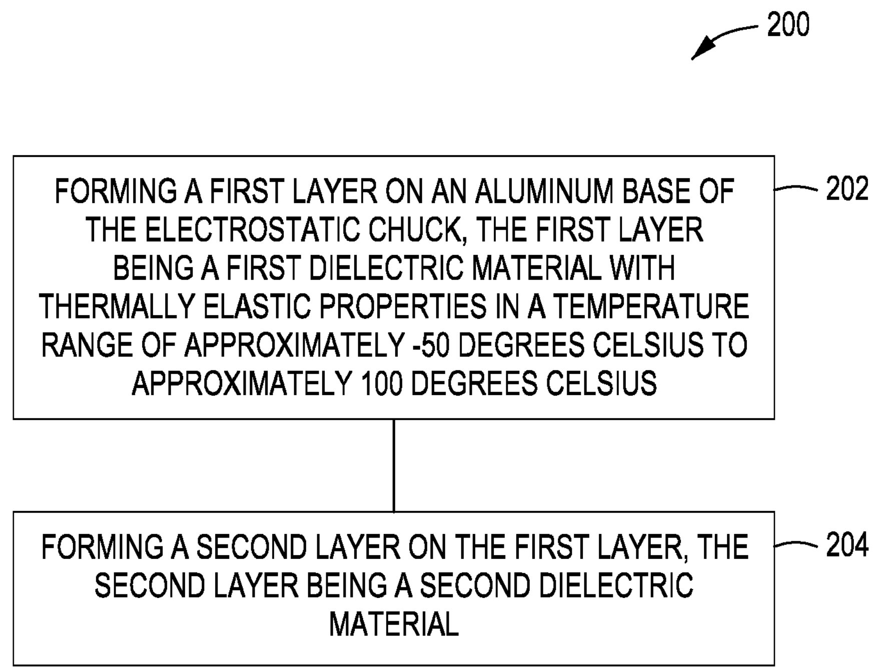
FIG. 2 is a method of increasing breakdown voltage levels for an electrostatic chuck in accordance with some embodiments of the present principles.
Figure 4:
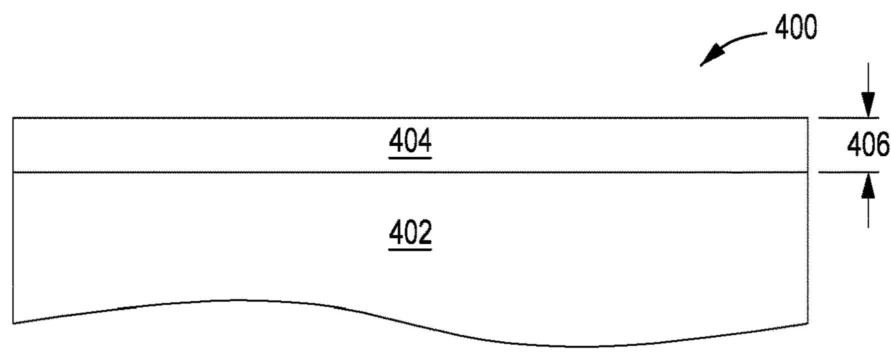
FIG. 4 is a cross-sectional view of an electrostatic chuck with a dielectric layer in accordance with some embodiments of the present principles.

FIG. 2 is a method 200 of increasing breakdown voltage levels for an electrostatic chuck in accordance with some embodiments. As illustrated in FIG. 4, an electrostatic chuck 400 has an aluminum base 402. In block 202 of the method 200, a first layer 404 is formed on the aluminum base 402 of the electrostatic chuck 400. The first layer 404 is a first dielectric material with thermally elastic properties in a temperature range of approximately −50 degrees Celsius to approximately 100 degrees Celsius. In some embodiments, the first dielectric material may include, but is not limited to, a form of aluminum oxide ($Al_2O_3$) such as a first dielectric material formed when the surface of the aluminum base 402 is anodized. In some embodiments, the anodization process may be performed using an acidic solution or an alkaline based solution, each resulting in a soft anodization layer with a different aluminum oxide structure on the aluminum base. When the anodization process is performed with a weak acid, a dense, random microstructure with a heavy interfacial reaction layer occurs when a high temperature, high current density process is used, eliminating formation of columnar structures in the first layer 404. In some embodiments, a chromatic anodization process may be used that utilizes chromate ions as found in a Type I anodization process. The soft anodization process preserves the thermal elasticity characteristic of the first dielectric material of the first layer 404. In some embodiments, a thickness 406 of the first layer 404 may be greater than zero to less than approximately 10 microns. Thicker layers (beyond 10 microns) may cause the first dielectric material to have a columnar structure which decreases conduction protection.

Figure 5:
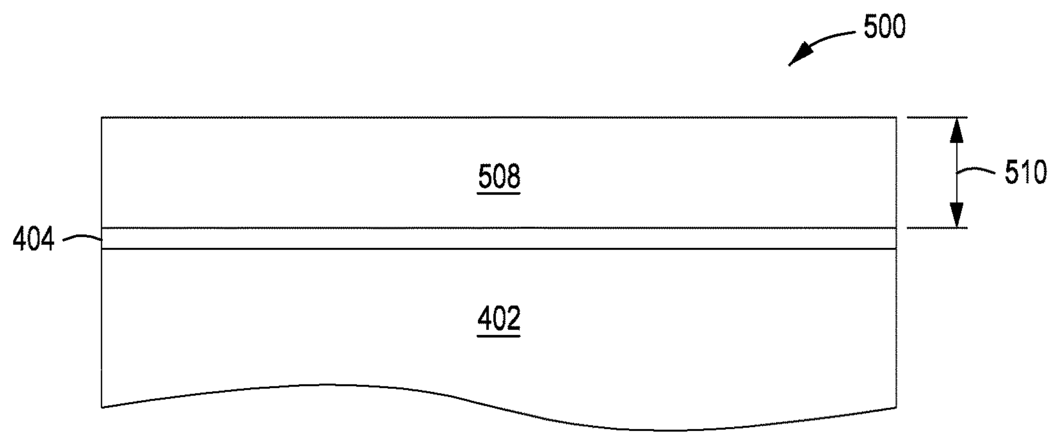
FIG. 5 is a cross-sectional view an electrostatic chuck with a first dielectric layer and a second dielectric layer in accordance with some embodiments of the present principles.

In block 204 of the method 200, a second layer 508 (as shown in the electrostatic chuck 500 of FIG. 5) of a second dielectric material is formed on the first layer 404. In some embodiments, the second dielectric material may be a ceramic based material such as alumina with a high melting point to provide high temperature protection of the electrostatic chuck 400. In some embodiments, a thickness 510 of the second layer 408 may be in a range of approximately 200 microns to approximately 300 microns. As described above, the first layer 404 provides an insulation layer against conduction to aid in preventing arcing due to the porosity of the second layer 508 and/or due to the poor application coverage of the second layer 508 which may lead to arcing and lower breakdown voltages of the electrostatic chuck 400. In addition, the first layer 404 provides a thermally elastic layer to provide thermal expansion and contraction stress relief between the aluminum base and the second layer 508 to prevent cracking of the second layer 508 which may lead to arcing and lower breakdown voltages of the electrostatic chuck 400. Aluminum has a linear thermal expansion coefficient of 21-24 ($10^{-6}$ m/mK). Alumina has a linear thermal expansion coefficient of 8.1 (approximately one third of the coefficient for aluminum). The inventors have found that the large disparity between aluminum and alumina causes cracking of the alumina after large temperature changes (heating/cooling) in a process chamber. The first layer 404 provides a thermal expansion buffer due to the thermal elasticity of the first layer 404 to reduce/eliminate thermal changes as a source of arcing and low breakdown voltages, increasing the breakdown voltage of the electrostatic chuck 400.

Figure 3:
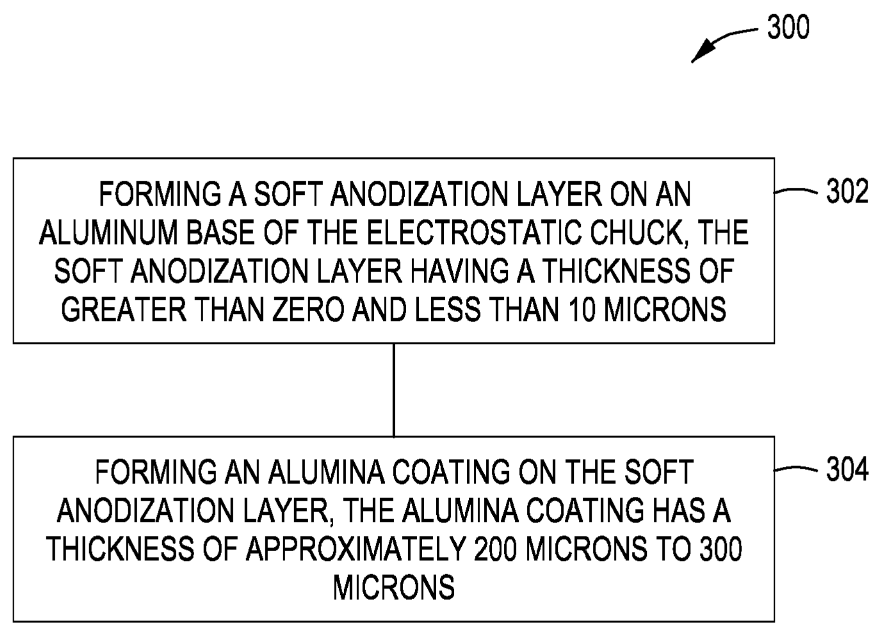
FIG. 3 is another method of increasing breakdown voltage levels for an electrostatic chuck in accordance with some embodiments of the present principles.

FIG. 3 is another method 300 of increasing breakdown voltage levels for an electrostatic chuck in accordance with some embodiments. In block 302, a soft anodization layer is formed on an aluminum base of the electrostatic chuck. The soft anodization layer having a thickness of greater than zero and less than approximately 10 microns. As discussed above, the soft anodization layer is formed with a weak acid process that prevents formation of a columnar structure within the soft anodization layer. In block 304, an alumina coating is formed on the soft anodization layer. The alumina coating has a thickness of approximately 200 microns to 300 microns.

Figure 6:
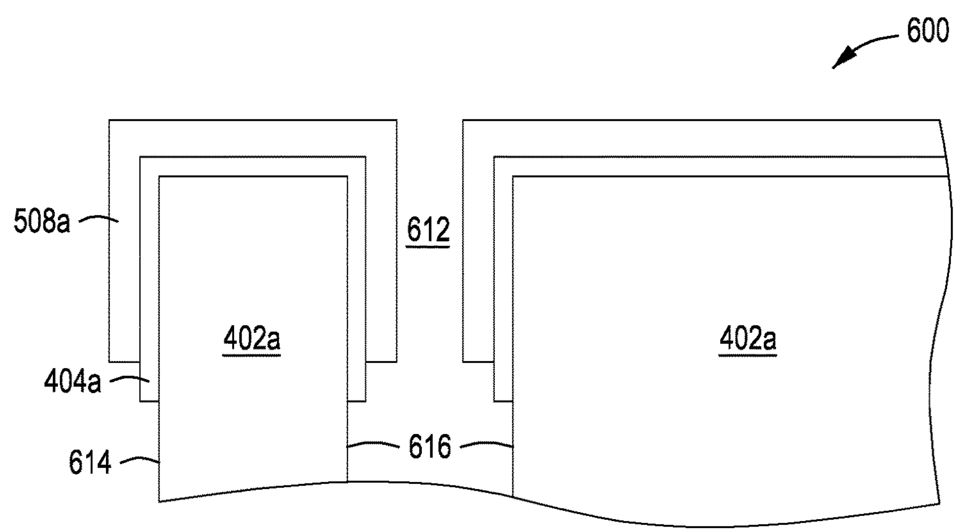
FIG. 6 is a cross-sectional view of an electrostatic chuck with extended coverage in accordance with some embodiments of the present principles.

FIG. 6 is a cross-sectional view of an electrostatic chuck 600 with extended coverage in accordance with some embodiments. In some embodiments, the aluminum base 402*a* of the electrostatic chuck 600 may have a first extended layer 404*a* that may extend over a side 614 of the aluminum base 402*a* to provide added protection. In some embodiments, a second extended layer 508*a* may also extend over the side 614 of the aluminum base 402*a* on at least a portion of the first extended layer 404*a*. The coverage of the side 614 of the aluminum base 402*a* may differ between the coverage of the first extended layer 404*a* and the coverage of the second extended layer 508*a* (e.g., the first extended layer 404*a* may not be fully covered by the second extended layer 508*a* on the side 614). In some embodiments, the second extended layer 404*a* may provide coverage of at least a portion of sidewalls 616 of a lift pin hole 612. In some embodiments, the second extended layer 508*a* may provide coverage of at least a portion of the first extended layer 404*a* found on the sidewalls 616 of the lift pin hole 612. The coverage of the sidewalls 616 of the lift pin hole 612 may differ between the coverage of the first extended layer 404*a* and the coverage of the second extended layer 508*a* (e.g., the first extended layer may not be fully covered by the second extended layer 508*a* or the second extended layer 508*a* may not provide coverage inside the lift pin hole 612, etc.).

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An electrostatic chuck for holding substrates in a process chamber, the electrostatic chuck comprising:
- an aluminum base;
- an anodized layer on the aluminum base, wherein the anodized layer has a non-columnar structure and a thickness of greater than zero and less than approximately 10 microns; and
- an alumina layer on the anodized layer, wherein the alumina layer has a thickness of approximately 200 microns to approximately 300 microns.

2. The electrostatic chuck of claim 1, wherein the electrostatic chuck has a breakdown voltage of approximately 2 kV or more.

3. The electrostatic chuck of claim 1, wherein the anodized layer is a soft anodized layer.

4. The electrostatic chuck of claim 1, wherein the anodized layer is configured to provide thermal expansion and contraction stress relief between the aluminum base and the alumina layer to reduce cracking of the alumina layer.

5. The electrostatic chuck of claim 1, wherein the alumina layer is formed by spray coating alumina on the anodized layer.

6. The electrostatic chuck of claim 1, wherein the anodized layer provides approximately 10 volts of insulative protection for approximately every one micron of thickness.

7. The electrostatic chuck of claim 1, wherein the anodized layer is thermally elastic in a temperature range of approximately −50 degrees Celsius to approximately 100 degrees Celsius.

8. An electrostatic chuck for holding substrates in a process chamber, the electrostatic chuck comprising:
- an aluminum base;
- an anodized layer on the aluminum base, wherein the anodized layer is a soft anodized layer with a non-columnar structure and a thickness of greater than zero and less than approximately 10 microns; and an alumina layer on the anodized layer, wherein the alumina layer has a thickness of approximately 200 microns to approximately 300 microns, and wherein the electrostatic chuck has a breakdown voltage of approximately 2 kV or more.

9. The electrostatic chuck of claim 8, wherein the anodized layer is configured to provide thermal expansion and contraction stress relief between the aluminum base and the alumina layer to reduce cracking of the alumina layer.

10. The electrostatic chuck of claim 8, wherein the alumina layer is formed by spray coating alumina on the anodized layer.

11. The electrostatic chuck of claim 8, wherein the anodized layer provides approximately 10 volts of insulative protection for approximately every one micron of thickness.

12. The electrostatic chuck of claim 8, wherein the anodized layer is thermally elastic in a temperature range of approximately −50 degrees Celsius to approximately 100 degrees Celsius.

13. The electrostatic chuck of claim 8, wherein the breakdown voltage is approximately 2 kV to approximately 3 kV.

14. A method for increasing voltage breakdown levels of an electrostatic chuck, comprising:

forming a first layer on an aluminum base of the electrostatic chuck, the first layer being a first dielectric material with a non-columnar structure and thermally elastic properties in a temperature range of approximately −50 degrees Celsius to approximately 100 degrees Celsius; and forming a second layer on the first layer, the second layer being a second dielectric material, wherein the thermally elastic properties inhibit cracking of the second layer which has a coefficient of thermal expansion different from the aluminum base.

15. The method of claim 14, further comprising:

forming the first layer on the aluminum base using a soft anodization process that does not produce a columnar structure in the first layer.

16. The method of claim 14, further comprising:

forming the second layer by spray coating alumina on the first layer.

17. The method of claim 14, further comprising:

forming the first layer on the aluminum base with a thickness of greater than zero and less than approximately 10 microns.

18. The method of claim 14, further comprising:

forming the second layer on the first layer with a thickness of approximately 200 microns to approximately 300 microns.

19. The method of claim 14, wherein the first dielectric material provides approximately 10 volts of insulative protection for approximately every one micron of thickness.

20. The method of claim 14, wherein the first layer provides thermal expansion and contraction stress relief between the aluminum base and the second layer.

* * * * *